(12) United States Patent
Wittenberg et al.

(10) Patent No.: US 11,353,652 B1
(45) Date of Patent: Jun. 7, 2022

(54) ELECTRONIC DEVICES HAVING DISPLAYS WITH CURVED SURFACES AND IMAGE TRANSPORT LAYERS

(71) Applicant: Apple Inc., Cupertino, CA (US)

(72) Inventors: Michael B. Wittenberg, San Francisco, CA (US); Jean-Pierre S. Guillou, Los Gatos, CA (US); Tyler R. Kakuda, Stockton, CA (US); Christopher D. Prest, San Francisco, CA (US); Marwan Rammah, San Francisco, CA (US); Rasamy Phouthavong, San Jose, CA (US); Richard H. Dinh, Saratoga, CA (US); Steven P. Hotelling, Los Gatos, CA (US); Yi Qiao, San Jose, CA (US); Michael J. Brown, Campbell, CA (US); Hao Dong, Santa Clara, CA (US); David A. Pakula, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 39 days.

(21) Appl. No.: 16/505,553

(22) Filed: Jul. 8, 2019

Related U.S. Application Data (60) Provisional application No. 62/696,289, filed on Jul. 10, 2018.

(51) Int. Cl.
*G02B 6/06* (2006.01)
*H01L 27/32* (2006.01)
(Continued)

(52) U.S. Cl.
CPC ............ *G02B 6/06* (2013.01); *H01L 27/3267* (2013.01); *H01L 51/5253* (2013.01);
(Continued)

(58) Field of Classification Search
None
See application file for complete search history.

(56) References Cited

U.S. PATENT DOCUMENTS

| 4,349,817 A | 9/1982 | Hoffman et al. |
|---|---|---|
| 4,534,813 A | 8/1985 | Williamson et al. |

(Continued)

FOREIGN PATENT DOCUMENTS

KR 20180034832 A 4/2018

*Primary Examiner* — Michael Stahl
(74) *Attorney, Agent, or Firm* — Treyz Law Group, P.C.; G. Victor Treyz; David K. Cole (57) ABSTRACT

An electronic device may have a display overlapped by a cover layer. Portions of the surface of the display and cover layer may have curved profiles. The display may include a flexible substrate and may have bent edge portions protruding from a central region. Gaps may be formed between regions of pixels on a common substrate or between separate display panels. An image transport layer formed from a coherent fiber bundle or a layer of Anderson localization material configured to exhibit two-dimensional transverse Anderson localization of light may have an input surface that receives an image from adjacent display pixels and an output surface on which the image is displayed. The output surface may have a curved profile and may exhibit compound curvature. The input surface may have a profile with curved portions or other shapes. Image transport layers can be used to cover gaps between sets of pixels.

18 Claims, 11 Drawing Sheets

(51) Int. Cl.
*H01L 51/52* (2006.01)
*H04M 1/02* (2006.01)

(52) U.S. Cl.
CPC ......... *H04M 1/0268* (2013.01); *H01L 27/323* (2013.01); *H01L 27/3286* (2013.01); *H01L 2251/5338* (2013.01); *H04M 1/0266* (2013.01)

(56) References Cited

U.S. PATENT DOCUMENTS

| | | | |
|---|---|---|---|
| 5,329,386 A | 7/1994 | Birecki et al. | |
| 5,502,457 A | 3/1996 | Sakai et al. | |
| 5,659,378 A | 8/1997 | Gessel | |
| 6,046,730 A | 4/2000 | Bowen et al. | |
| 6,407,785 B1 | 6/2002 | Yamazaki | |
| 6,467,922 B1 | 10/2002 | Blanc et al. | |
| 6,680,761 B1 | 1/2004 | Greene et al. | |
| 6,845,190 B1 | 1/2005 | Smithwick et al. | |
| 7,228,051 B2 | 6/2007 | Cok et al. | |
| 7,542,209 B2 | 6/2009 | McGuire, Jr. | |
| 7,823,309 B2 | 11/2010 | Albenda | |
| 7,856,161 B2 | 12/2010 | Tabor | |
| 8,045,270 B2 | 10/2011 | Shin et al. | |
| 8,723,824 B2 | 5/2014 | Myers et al. | |
| 8,824,779 B1 | 9/2014 | Smyth | |
| 8,976,324 B2 | 3/2015 | Yang et al. | |
| 9,268,068 B2 | 2/2016 | Lee | |
| 9,312,517 B2 | 4/2016 | Drzaic et al. | |
| 9,342,105 B2 | 5/2016 | Choi et al. | |
| 9,509,939 B2 | 11/2016 | Henion et al. | |
| 9,591,765 B2 | 3/2017 | Kim et al. | |
| 9,755,004 B2 | 9/2017 | Shieh et al. | |
| 9,818,725 B2 | 11/2017 | Bower et al. | |
| 9,907,193 B2 | 2/2018 | Lee et al. | |
| 10,048,532 B2 | 8/2018 | Powell et al. | |
| 10,052,831 B2 | 8/2018 | Welker et al. | |
| 11,215,752 B1* | 1/2022 | Lin | G02B 6/02295 |
| 11,231,814 B1* | 1/2022 | Wittenberg | G02B 6/06 |
| 2006/0016448 A1 | 1/2006 | Ho | |
| 2007/0097108 A1 | 5/2007 | Brewer | |
| 2008/0144174 A1 | 6/2008 | Lucente et al. | |
| 2008/0186252 A1 | 8/2008 | Li | |
| 2010/0177261 A1 | 7/2010 | Jin et al. | |
| 2010/0238090 A1 | 9/2010 | Pomerantz et al. | |
| 2011/0025594 A1 | 2/2011 | Watanabe | |
| 2011/0057861 A1 | 3/2011 | Cok et al. | |
| 2011/0102300 A1 | 5/2011 | Wood et al. | |
| 2011/0242686 A1 | 10/2011 | Wantanbe | |
| 2011/0255301 A1* | 10/2011 | Watanabe | G02F 1/13336 362/558 |
| 2012/0218219 A1 | 8/2012 | Rappoport et al. | |
| 2013/0081756 A1 | 4/2013 | Franklin et al. | |
| 2013/0083080 A1 | 4/2013 | Rappoport et al. | |
| 2013/0235560 A1 | 9/2013 | Etienne et al. | |
| 2013/0279088 A1 | 10/2013 | Raff et al. | |
| 2014/0037257 A1 | 2/2014 | Yang et al. | |
| 2014/0092028 A1 | 4/2014 | Prest et al. | |
| 2014/0092346 A1 | 4/2014 | Yang et al. | |
| 2014/0183473 A1 | 7/2014 | Lee et al. | |
| 2014/0240985 A1 | 8/2014 | Kim et al. | |
| 2014/0328041 A1 | 11/2014 | Rothkopf et al. | |
| 2014/0354920 A1 | 12/2014 | Jang et al. | |
| 2015/0093087 A1 | 4/2015 | Wu | |
| 2015/0227227 A1 | 8/2015 | Myers et al. | |
| 2016/0231784 A1 | 8/2016 | Yu et al. | |
| 2016/0234362 A1 | 8/2016 | Moon et al. | |
| 2017/0235341 A1 | 8/2017 | Huitema et al. | |
| 2018/0052312 A1 | 2/2018 | Jia et al. | |
| 2018/0088416 A1 | 3/2018 | Jiang et al. | |
| 2018/0113241 A1* | 4/2018 | Powell | G02B 5/045 |
| 2018/0128973 A1* | 5/2018 | Powell | G02B 6/06 |
| 2018/0372958 A1 | 12/2018 | Karafin et al. | |

\* cited by examiner

ELECTRONIC DEVICES HAVING DISPLAYS WITH CURVED SURFACES AND IMAGE TRANSPORT LAYERS

This application claims the benefit of provisional patent application No. 62/696,289, filed Jul. 10, 2018, which is hereby incorporated by reference herein in its entirety.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may distort images.

SUMMARY

An electronic device may have a display for displaying images. A display cover layer may overlap the display. Portions of the surface of the display and cover layer may have curved profiles. For example, the edge of the display may be bend and the cover layer may have corresponding curved edge profiles.

The display may include a flexible substrate and may have bent edge portions protruding from a central region. For example, the display may be an organic light-emitting diode display formed on a flexible substrate. The organic light-emitting diode display may have elongated protrusions that run along the edges of a rectangular central region. The protrusions may be bent along axes that run parallel to the peripheral edges of the display to form curved display edges. Display structures in the device may cover a front face, rear face, and/or sidewalls portions of a device.

Gaps may be formed between regions of display pixels on a common substrate and gaps may be formed between separate display panels in the electronic device. An image transport layer formed from a coherent fiber bundle or a layer of Anderson localization material configured to exhibit two-dimensional transverse Anderson localization of light may have an input surface that receives an image from display pixels that are adjacent to the input surface. The image transport layer may also have an output surface on which the image is displayed after being transported through the image transport layer while being laterally confined within the image transport layer.

The output surface of the image transport layer may have a curved profile and may exhibit compound curvature. The input surface may have a profile with curved portions or other shapes. Image transport layers can be configured to form multiple input surfaces separated by gaps. These image transport layers may be used to merge images from sets of pixels that are separated by gaps so that a unitary merged image is displayed on the output surface.

Touch sensor circuitry such as two-dimensional capacitive touch sensor circuitry may be incorporated into the displays. For example, a two-dimensional touch sensor formed on a separate touch sensor panel may overlap an array of display pixels. If desired, a two-dimensional touch sensor may be formed from circuitry on the same panel as the display pixels of the display.

DETAILED DESCRIPTION

Electronic devices may be provided with displays. The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration.

Figure 1:
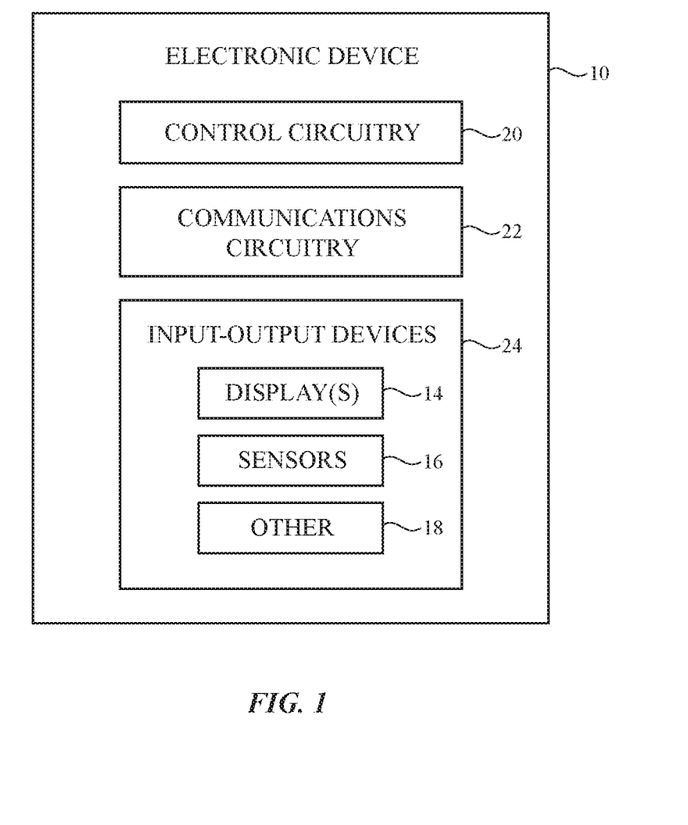
FIG. 1 is a schematic diagram of an illustrative electronic device in accordance with an embodiment.

A schematic diagram of an illustrative electronic device having a display with curved surface portions is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
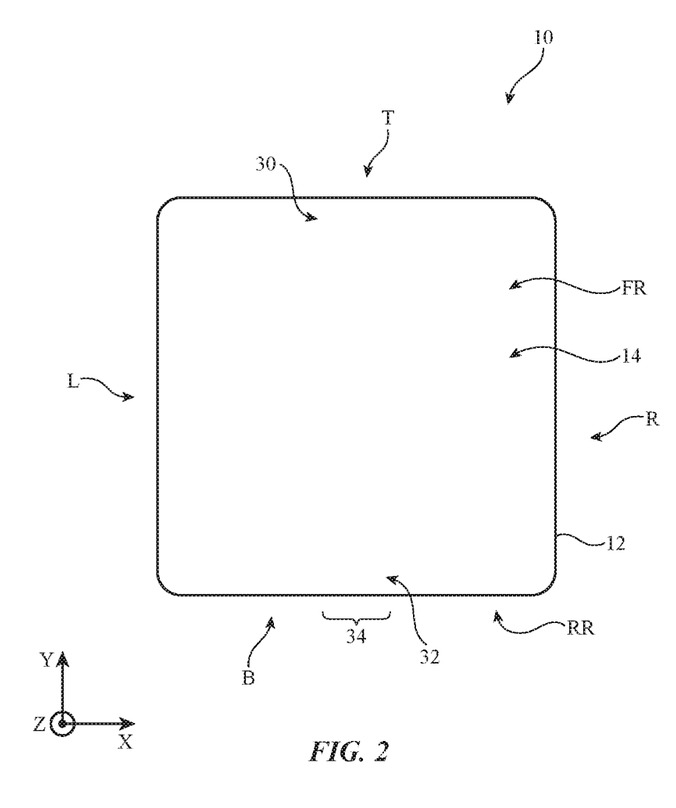
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more display panels in device 10 as separate touch sensor panels overlapping display pixels or may be formed as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or edges T, B, R, and/or L and may overlap touch sensor circuitry. Haptic output devices may be used to provide haptic feedback when virtual buttons are selected (as an example).

Device 10 of FIG. 2 has a rectangular outline with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A finger print sensor, touch sensor button, force-sensitive button, or other sensor that operates through display 14 may be formed under the portion of display in lower region 32 on front face FR and/or other portions of front face FR and/or other external surfaces of device 10. An optional opening for a connector (e.g., a digital data connector, analog signal connector, and/or power connector) may be formed in portion 34 of the lower sidewall of device 10 running along lower edge B. This opening may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
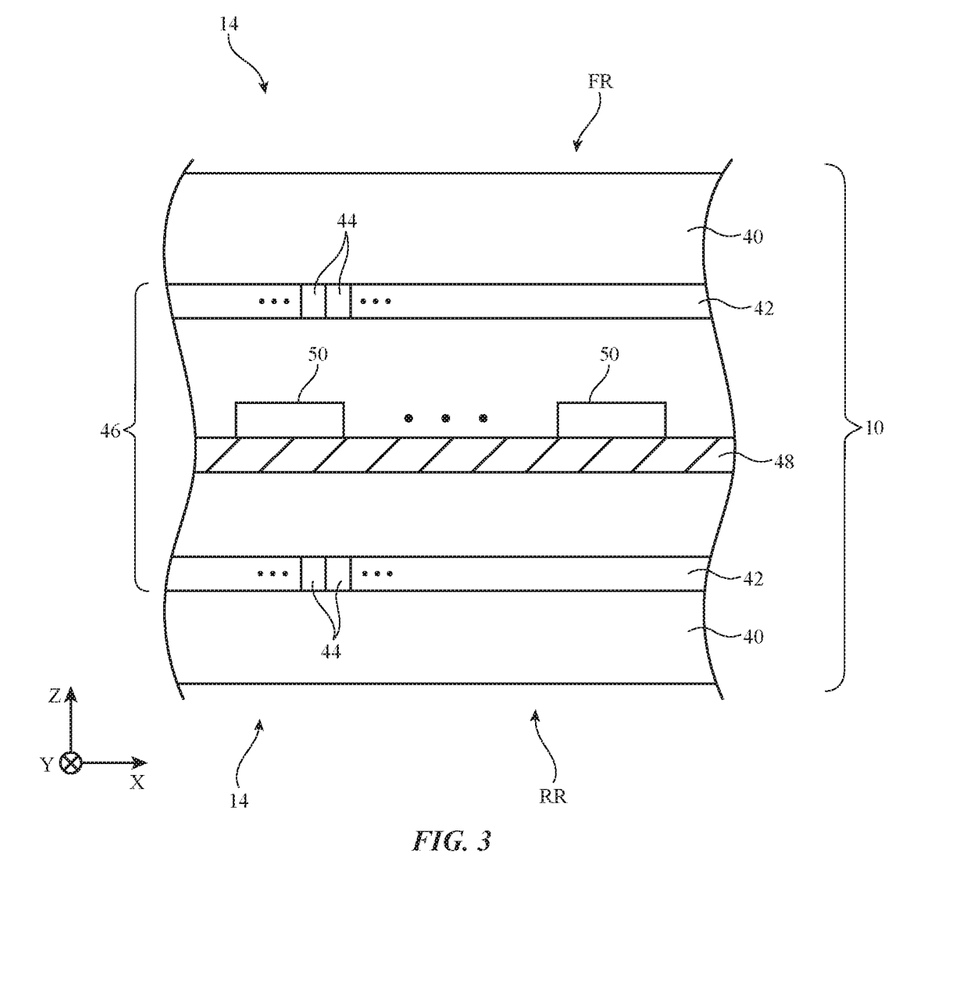
FIG. 3 is a cross-sectional side view of an illustrative electronic device in accordance with an embodiment.

FIG. 3 is a cross-sectional side view of an illustrative electronic device. As shown in FIG. 3, display 14 may be formed on front face FR and/or rear face RR of device 10. Display 14 may include one or more transparent protective layers such as display cover layers 40. Display cover layers 40 may be formed from transparent material such as clear glass, polymer, sapphire or other crystalline material, or other transparent material. Display layers such as layers 42 may have arrays of pixels 44 that form images. The pixel arrays (e.g., layers 42) may sometimes be referred to as pixel layers, pixel array layers, displays, display structures, display layers, or display panels. For example, layers 42 may be formed from organic light-emitting diode displays. In the example of FIG. 3, device 10 has a first display 14 (or first display portion of a display panel) formed from a first pixel array 42 on front face FR. This first pixel array is visible in the −Z direction through display cover layer 40 on front face FR. Device 10 of FIG. 3 also has a second display 14 (or second display portion of the display panel) formed from a second pixel array 42 on rear face RF. This second pixel array is visible in the +Z direction through display cover layer 40 on rear face RR. The front and/or rear surfaces formed by display cover layer(s) 40 may be planar (as shown in FIG. 3) or may have a curved profile.

If desired, the second display 14 of device 10 may be omitted. For example, pixel array 42 on rear face RR may be omitted. In this configuration, the inner surface of layer 40 on rear face RR may be coated with a black masking material or other opaque coating and/or may be coated with colored and/or shiny structures. Coating material can be patterned to form logos, text, and other visual elements. This type of arrangement may be used to hide internal components in interior 46 of device from view from the exterior of device 10. As shown in FIG. 3, for example, device 10 may include electrical components 50 in interior 46 (e.g., integrated circuits, sensors and other input-output devices, control circuitry, display layers 42 such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In configurations such as these in which the lower pixel array of device 10 is omitted, the portion of device 10 on rear face RR (e.g., layer 40) may be formed from metal (e.g., a stainless steel or aluminum layer). For example, device 10 may have a rear housing wall formed from metal. Device 10 may also have housing walls formed from opaque glass, transparent glass coated with opaque materials such as ink or metal, and/or other housing wall materials.

In some configurations for device 10, an opaque material such as metal or opaque polymer may form some or all of the sidewalls of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of display cover layers 40 of FIG. 3 (e.g., an extending piece of glass, polymer, crystalline material, etc.). Because clear layers of glass, plastic, crystalline material, and/or other clear layers of material in device 10 may enclose and protect internal device components, these outer layers of material in device 10 serve as an enclosure (housing 12) for device 10.

In configurations for device 10 in which sidewalls have transparent portions formed from extending portions of display cover layers 40 or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

During operation, light emitted from the pixels or other light-emitting components under the sidewalls may pass through the sidewalls. In arrangements in which display panels are placed under transparent sidewalls, images may be displayed through the sidewalls. The images may form parts of images being displayed on front face FR and/or rear face RR and/or may be separate images. For example, a photograph may extend across front face FR and some or all of the sidewalls of device 10 and/or a photograph may cover only front face FR while virtual buttons are displayed on the sidewalls of device 10. In arrangements in which one or more light-emitting diodes and an overlapping diffuser are placed under transparent sidewalls, diffuse light may be emitted through the sidewalls.

In addition to optional opaque housing structures such as metal housing walls or opaque walls formed from other materials, device 10 may include display cover layers 40 and other structures formed from transparent glass, transparent polymer, and/or other transparent material. These materials may surround the interior of device 10 and thereby serve as a housing for device 10 as well as serving as protective layers for pixel arrays and other light-emitting components. In the example of FIG. 3, the front surface of device 10 is formed by a planar surface of display cover layer 40 on front face FR and the rear surface of device 10 is formed by a planar surface of display cover layer 40 on rear face RR. In general, device 10 may have planar surface portions and/or curved surface portions (surface portions with curved profiles) and these portions may be formed by display cover layers, other layers formed from glass, polymer, sapphire or other crystalline material, ceramic, or other potentially transparent materials, metal, wood, or other materials.

Figure 4:
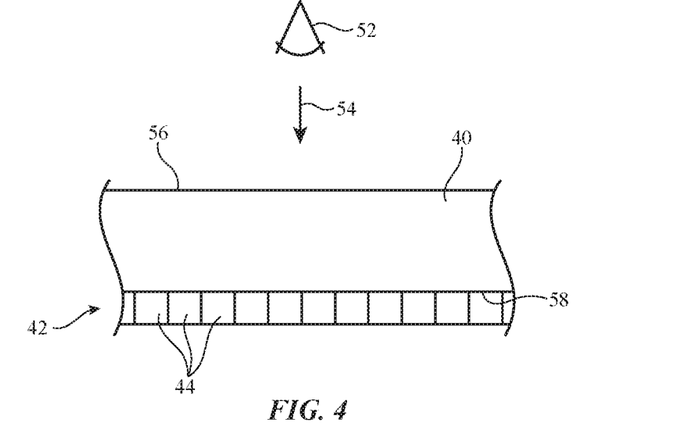
FIG. 4 is a cross-sectional side view of an illustrative planar portion of a display cover layer and pixel array in accordance with an embodiment.
Figure 5:
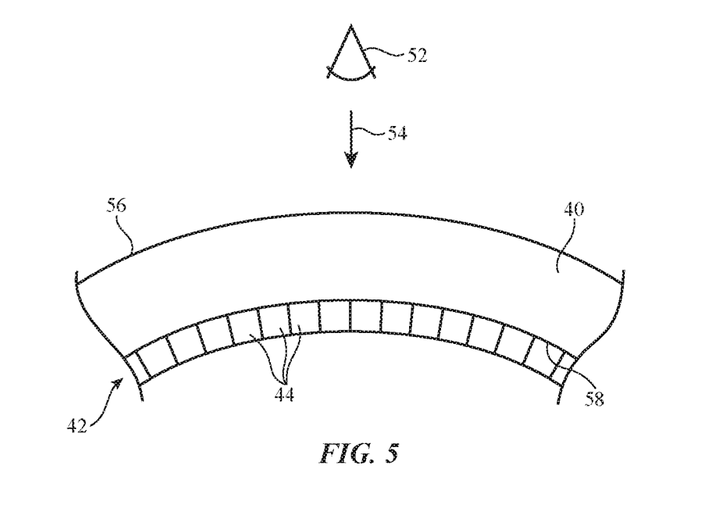
FIG. 5 is a cross-sectional side view of an illustrative curved portion of a display cover layer and pixel array in accordance with an embodiment.

Transparent portions of device 10 may overlap pixels or other light-emitting components that emit light that is visible to a user. In the illustrative arrangements of FIGS. 4 and 5, an array of pixels 44 in layer 42 is configured to emit light that passes through display cover layer 40 for viewing by viewer 52 (e.g., in direction 54 and/or other directions from the exterior of device 10). The inner and outer surface of layers 40 (and other layers enclosing the interior of device 10) may be planar and/or curved. In the illustrative configuration of FIG. 4, outer surface 56 of layer 40 and inner surface 58 of layer 40 are planar. Inner surface 58 of FIG. 4 may be curved or partly planar and partly curved, if desired. In the illustrative configuration of FIG. 5, outer surface 56 of layer 40 is curved and inner surface 58 of layer 40 is curved. Inner surface 58 may, if desired, be planar or may have planar and curved surface profile portions.

Figure 6:
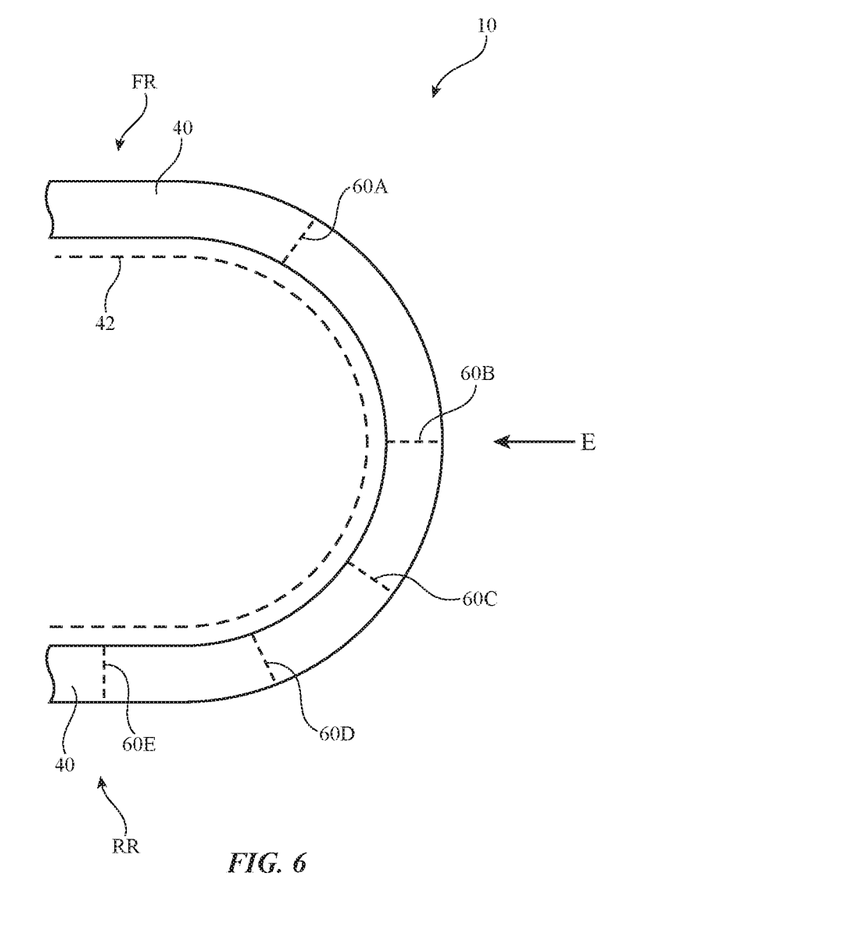
FIG. 6 is a cross-sectional side view of an illustrative sidewall portion of an electronic device in accordance with an embodiment.

Device 10 may have upper and/or lower surfaces (e.g., external surfaces 56 on front face FR and rear face RR, respectively) that are planar and/or curved. The edges of device 10 may have sidewalls with planar and/or curved portions (e.g., surfaces with straight and/or curved profiles). As shown in FIG. 6, for example, the sidewalls of device 10 along one or more edges such as edge E of device 10 (e.g., left edge L, right edge R, upper edge T, lower edge B, and/or the corners of device 10) may have a curved outer surface.

Edge E may be transparent (e.g., the entire sidewall of device 10 may be transparent and may be formed from extended portions of upper and lower display cover layers 40) and/or one or more portions of the curved sidewall of edge E may be opaque (e.g., formed from glass or other material that is coated with opaque material, formed from opaque polymer, formed from metal, and/or formed from other opaque structures). Opaque structures (e.g., metal housing wall portions) may extend along one or more portions of edge E (e.g., metal or other opaque material may form the portion of edge E between locations 60A and 60B, between locations 60B and 60C, between locations 60C and 60D, between locations 60D and 60E, between locations 60A and 60C, between locations 60B and 60D, between locations 60C and 60E, or between other suitable locations on edge E. There may be a single strip of metal housing material that runs around all four peripheral edges E of device 10, there may be a pair of discrete strips of metal housing material that run around all four peripheral edges E in parallel, there may be no non-glass structures on edges E, and/or there may be other suitable structures on edges E.

Display layer 42 may be formed from a single panel (e.g., a single flexible organic light-emitting diode display panel having a polyimide substrate or other flexible substrate with bent edge portions), may be formed from multiple panels (e.g., multiple panels separated from one or more gaps), may be formed from panels with slots and other openings, and/or may be formed from other types of displays. Portions of display layer 42 (e.g., all of layer 42 and/or the pixels and/or other structures of layer 42) may be omitted wherever layer 42 is overlapped by a metal portion of edge E and/or other opaque structures in edge E. For example, edge E may be formed from glass everywhere except between locations 60B and 60D. The portion of edge (sidewall) E between locations 60B and 60D may be formed from metal (as an example). In this type of scenario, no display layer 42 (or at least no pixels 44) may be overlapped by the metal and pixels 44 and display layer 42 may be present under the glass portions of edge E and/or display cover layer 40 on front face FR and/or rear face RR.

Figure 7:
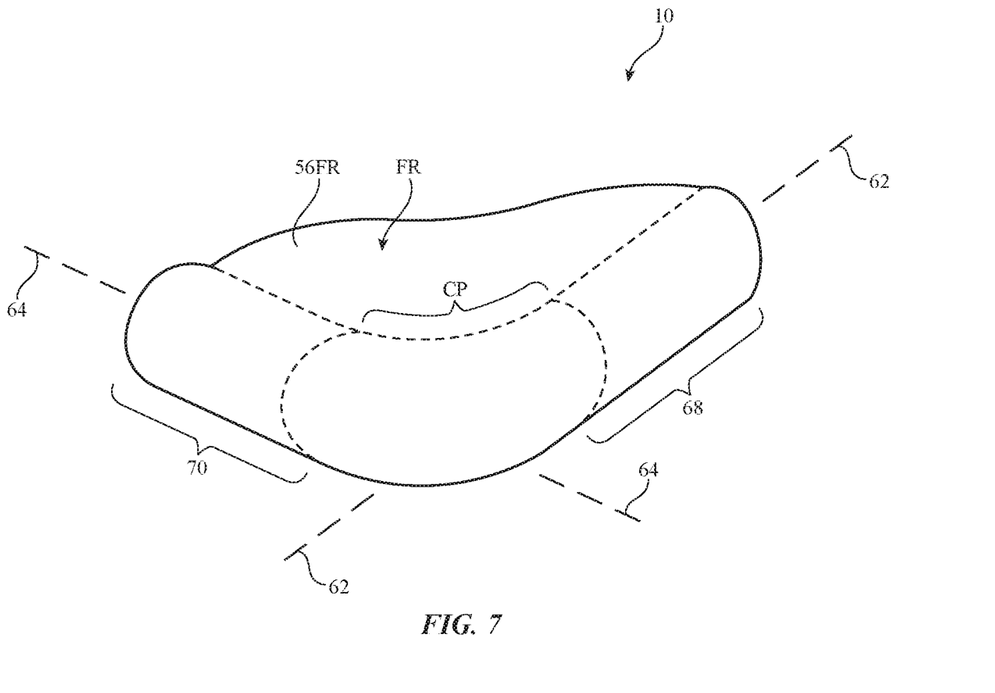
FIG. 7 is a perspective view of an illustrative corner portion of an electronic device in accordance with an embodiment.

If desired, device 10 may have external surfaces with compound curvature. A perspective view of an illustrative corner portion of device 10 is shown in FIG. 7. In the example of FIG. 7, device 10 has edge portions (sidewalls) 68 and 70 with surfaces that curve about axes 62 and 64, respectively. These portions extend along the straight sides of device 10 and are characterized by curved surfaces that can be flattened into a plane without distortion (sometimes referred to as developable surfaces). At the corner of device 10, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70. In compound curvature regions such as corner regions of device 10, display 14 can be formed from materials that stretch (e.g., displays formed from mesh-shaped elastomeric substrate material), may be formed from flexible displays that are patterned to create flexible strips and other structures that can be bent to cover at least part of the compound curvature regions, and/or may use optical structures (e.g., lenses, etc.) to redirect light emitted from pixels in a display to surfaces with compound curvature.

With one illustrative arrangement, which is sometimes described herein as an example, device 10 includes one or more structures that transport image light from the surface of an array of pixels to another surface (e.g., a surface associated with the inner surface of a display cover layer or an outer surface of device 10) while preventing the light from spreading laterally and thereby preserving the integrity of the image. This allows the image produced by an array of pixels in a flat or curved display to be transferred from an input surface of a first shape at a first location to an output surface with compound curvature or other desired second shape at a second location. The image transport layer may therefore move the location of an image while changing the shape of the surface on which the image is presented. Examples of layers of material that can transfer image light in this way include coherent fiber bundles and Anderson localization material. These layers of material may sometimes be referred to herein as image transport layers or image transport structures.

Fiber bundles include fiber cores of a first refractive index surrounded by cladding (e.g., polymer binder) of a second, lower refractive index. The fiber cores may be formed from fibers of glass, polymer, or other transparent material. Core diameters may be, for example, at least 5 microns, at least 7 microns, at least 8 microns, at least 9 microns, less than 40 microns, less than 17 microns, less than 14 microns, less than 11 microns, or other suitable diameter. The fibers in a coherent fiber bundle extend parallel to each other (e.g., the fibers are longitudinally invariant along the direction of light propagation through the fiber bundle). Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material).

Fiber bundles and Anderson localization material can be formed into plates (e.g., layers with a thickness of at least 0.2 mm, at least 0.5 m, at least 1 mm, at least 2 mm, at least 5 mm, less than 20 mm, or other suitable thickness. The surfaces of the plates may be planar and/or may have curved profiles. Image transport layers such as these can be used to transport an image from a first surface (e.g., the surface of a pixel array) to a second surface (e.g., a surface in device 10 with compound curvature or other curved and/or planar surface shape) without causing the image light to spread laterally. For example, an image that is produced by a display can be transported 5 mm vertically through an image transport layer that is 5 mm thick and can then be viewed on the output surface of the image transport layer. As another example, an image transport layer may have a planar input surface and an output surface with a planar central region surrounded by curved edges and corners of compound curvature. With this type of arrangement, images produced by a display that rests against the planar input surface can be smoothly transported to an output surface without becoming blurred, even if the output surface contains curved portions such as areas of compound curvature. Curved surfaces can be formed by polishing, slumping heated fiber bundle material, molding under heat and/or pressure, etc.

Figure 8:
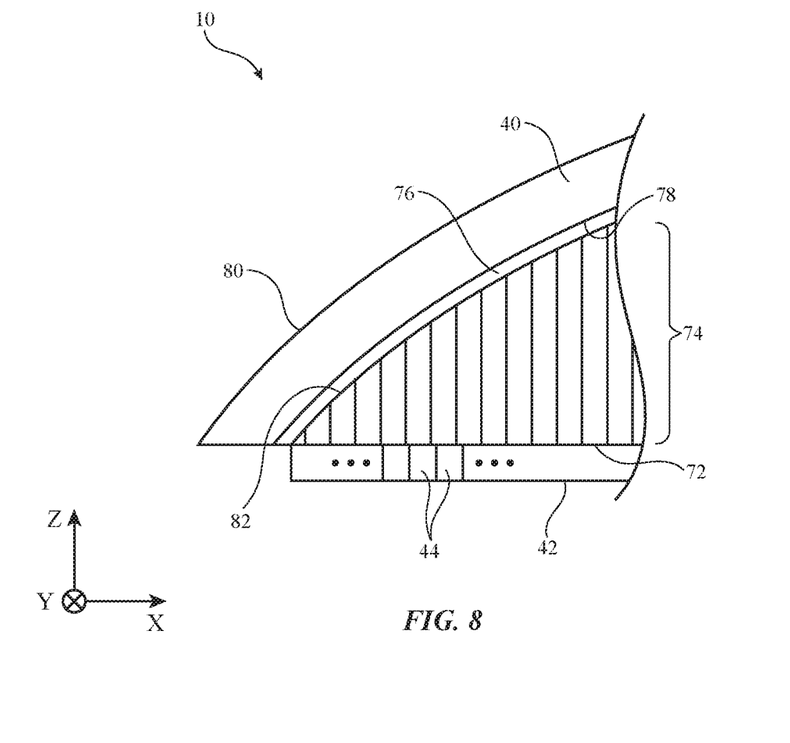
FIG. 8 is a cross-sectional side view of an edge portion of an electronic device having an image transport layer with a curved surface in accordance with an embodiment.

FIG. 8 is a cross-sectional side view of device 10 in an illustrative arrangement in which device 10 includes an image transport layer. Image transport layer 74 of FIG. 8 may be formed from a coherent fiber bundle or Anderson localization layer and may be invariant along the axis of light propagation (the Z axis in the example of FIG. 8). During operation, light emitted from pixels 44 of display layer 42 passes vertically through layer 74 from input surface 72 to output surface 82 (e.g., due to the vertically oriented fibers in the fiber bundle forming layer 74 or the longitudinally invariant refractive index features in an Anderson localization material forming layer 74). Input surface 72 may, if desired, be planar (e.g., display layer 42 and the array of pixels 44 in layer 42 may be planar) and may optionally extend across the front or rear of device 10 (e.g., across front face FR or rear face RR). Arrangements in which display layer 42, image transport layer 74, and display cover layer 40 cover some or all of the sidewalls of device 10 may also be used. The structures of FIG. 8 may, if desired, be located along a straight section of the peripheral edge of device 10 and/or along a rounded corner section of the peripheral edge of device 10. Output surface 82 may be curved (e.g., output surface 82 may exhibit a curved profile).

For example, output surface 82 may have compound curvature when image transport layer 74 is being used at a corner of device 10.

To help extract light from image transport layer 74 (e.g., to enhance viewing of displayed images in the −Z direction by a user of device 10), an optional layer such as layer 76 may cover the output surface 82 of image transport layer 74. Layer 76 may have diffusive material (e.g., layer 76 may be a diffuser layer formed from polymer or glass with embedded light scattering particles, textured polymer or glass, etc.), or may include a light extraction hologram. Textured surfaces, steps or angles formed in the fibers or other structures in layer 74, and/or other light extraction structures may also be used at the output of layer 74.

If desired, layer 76 may be a layer of adhesive or may include one or more layers of adhesive for attaching image transport layer 74 to optional covering structures such as display cover layer 40 or other transparent structures (sometimes referred to as transparent housing walls). Layer 40 may have a thickness that varies across the surface of layer 40 and/or may have a relatively uniform thickness (e.g., portions of inner surface 78 of layer 40 and outer surface 80 of layer 40 may be separated by an amount that varies across surface 80 and/or a fixed amount). If desired, layer 40 (and, if desired, layer 76) may be omitted on some or all of the exterior of device 10 (e.g., output surface 82 may form an outer surface for device 10 or the outer surface of an inorganic material or other material in layer 76 may form an outer surface for device 10). The use of layer 40 may help protect underlying layers such as layer 76 and layer 74 from damage during use of device 10.

Figure 9:
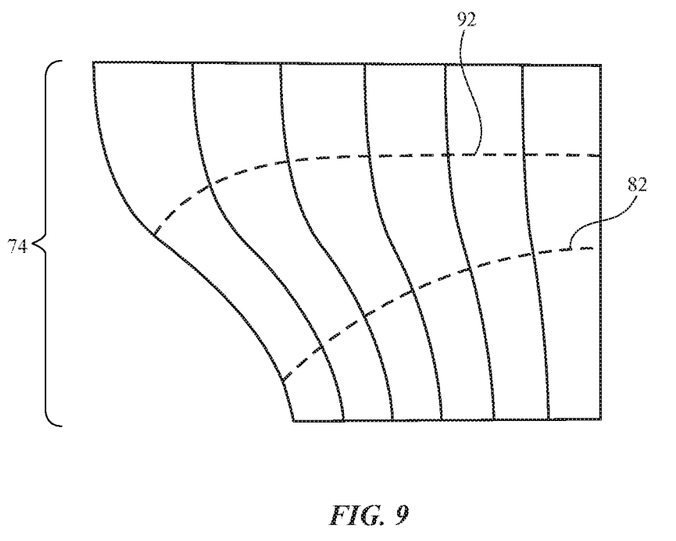
FIG. 9 is a cross-sectional side view of an illustrative image transport layer with tapered optical structures showing illustrative surface shapes for the image transport layer in accordance with embodiments.

Layer 74 may, if desired, be tapered (e.g., by forming layer 74 into a desired shape using heat and/or pressure). As shown in FIG. 9, for example, fibers or other structures in layer 74 may be flared outwardly. In shaping layer 74 for use in device 10, any suitable shape may be cut and polished into layer 74 (see, e.g., illustrative output surface shapes 82 and 92 in FIG. 9) and/or may be formed into layer 74 using molding or other fabrication techniques.

Figure 10:
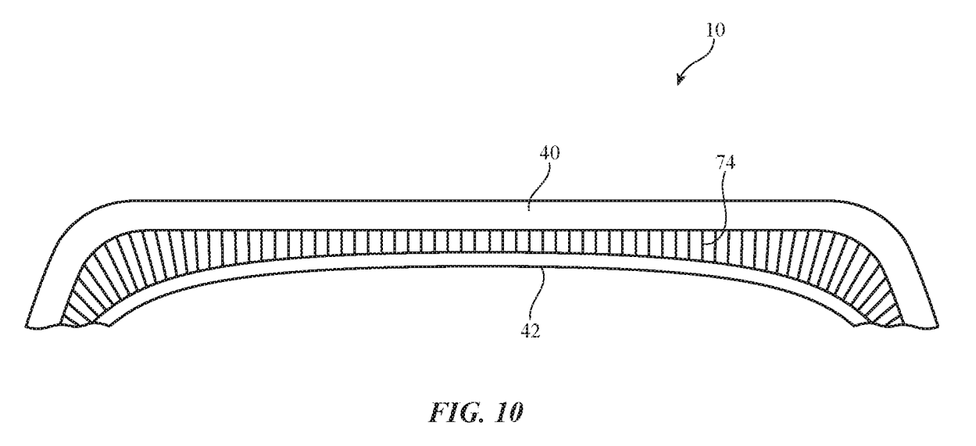
FIG. 10 is a cross-sectional side view of an illustrative display cover layer and image transport layer for an electronic device in accordance with an embodiment.

FIG. 10 is a cross-sectional side view of the outer layers forming an illustrative device 10 in an arrangement in which image transport layer 74 has a curved inner surface (e.g., one or more surface portions with curved profiles). Display 42 may be a flexible organic light-emitting diode display or other flexible display that can be bent to conform to the inner surface of image transport layer 74. By curving the inner surface of layer 74 over some or all of layer 74, additional interior volume may be created within device 10 to house components such as components 50 of FIG. 3.

Near the edges of image transport layer 74, the outer surface of image transport layer 74 may, if desired, be curved more strongly than the inner surface (e.g., to form curved side edges, to form surfaces with compound curvature at the corners of device 10, etc.). Display cover layer 40 (and layer 74) may have a planar central portion or a curved central portion. The periphery of cover layer 40 may be curved to form sidewall portions with curved profiles for device 10. Structures such as the display structures of FIG. 10 may be formed on front face FR, rear face RR, and edges T, B, L, and/or R of device 10.

Figure 11:
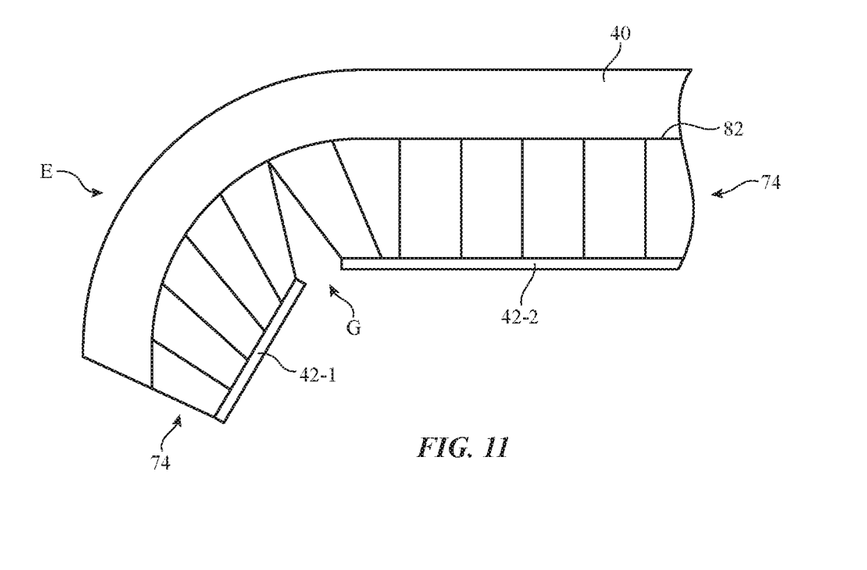
FIG. 11 is a cross-sectional side view of an edge portion of an electronic device with display areas that are coupled seamlessly using image transfer layer structures having an output surface profile with a curved portion in accordance with an embodiment.

FIG. 11 shows how an image transport layer may have portions configured to hide a gap G in display layer 42. In the example of FIG. 11, display layer 42 has two portions 42-1 and 42-2. Portions 42-1 and 42-2 may be separate display panels (e.g., first and second pixel arrays in first and second respective organic light-emitting diode display panels separated by gap G) or may be parts of a single display substrate (e.g., a single organic light-emitting diode display) that are separated by a slot forming gap G. If desired, portion 42-1 may form a single strip that runs around the entire periphery of device 10 and gap G may have a rectangular shape with rounded corners. Arrangements in which there are four (or two) separate displays such as portion 42-1 each of which produces an image associated with a respective one of the four edges R, L, T, and B of device 10 (or a pair of these edges) may also be used. Each of these edges may have a curved profile as illustrated by curved edge E of FIG. 11.

The presence of gaps between the pixels of portions 42-1 and 42-2 such as gap G may be unsightly to a user of device 10. To help hide gap G from view, image transport layer 74 may have a first input surface that lies adjacent to display portion 42-1 and a second input surface that lies adjacent to display portion 42-2. A first portion of layer 74 receives a first image portion from display portion 42-1 and a second portion of layer 74 receives a second image portion from display portion 42-2. Layer 74 has a shape that has a gap at its input surface (e.g., a gap aligned with gap G in the display) and that has no gap at its output surface (surface 82). In operation, layer 74 merges the first and second image portions from the first and second input surfaces of first and second respective display portions 42-1 and 42-2 to form a merged unitary image at output surface 82. Optional display cover layer 40 (and, if desired, an intervening layer of light extraction structures and/or adhesive) may cover output surface 82. In the example of FIG. 11, output surface 82 has a planar portion (e.g., a planar portion along front face FR or rear face RR) and has curved portions (e.g., curved edges for forming curved sidewall surfaces for device 10). If desired, surface 82 of layer 74 may have a corner portion or other portion with compound curvature. The front and/or the back of device 10 can be covered with display pixels using arrangements of the type shown in FIG. 11.

In the example of FIG. 11, display portions 42-1 and 42-2 have input surfaces that are planar. If desired, portion 42-1 and/or portion 42-2 may have a curved profile and image transport layer 74 may have corresponding curved inner surface profiles that receive images from portions 42-1 and 42-2. Display cover layer 40 may overlap image transport layer 74 in the center of device 10, along straight peripheral edges of device 10, and in corner portions of device 10. For example, display cover layer 40 of FIG. 11 may have a portion that extends over a corner portion of image transport layer 74 that has an output surface with compound curvature.

Figure 12:
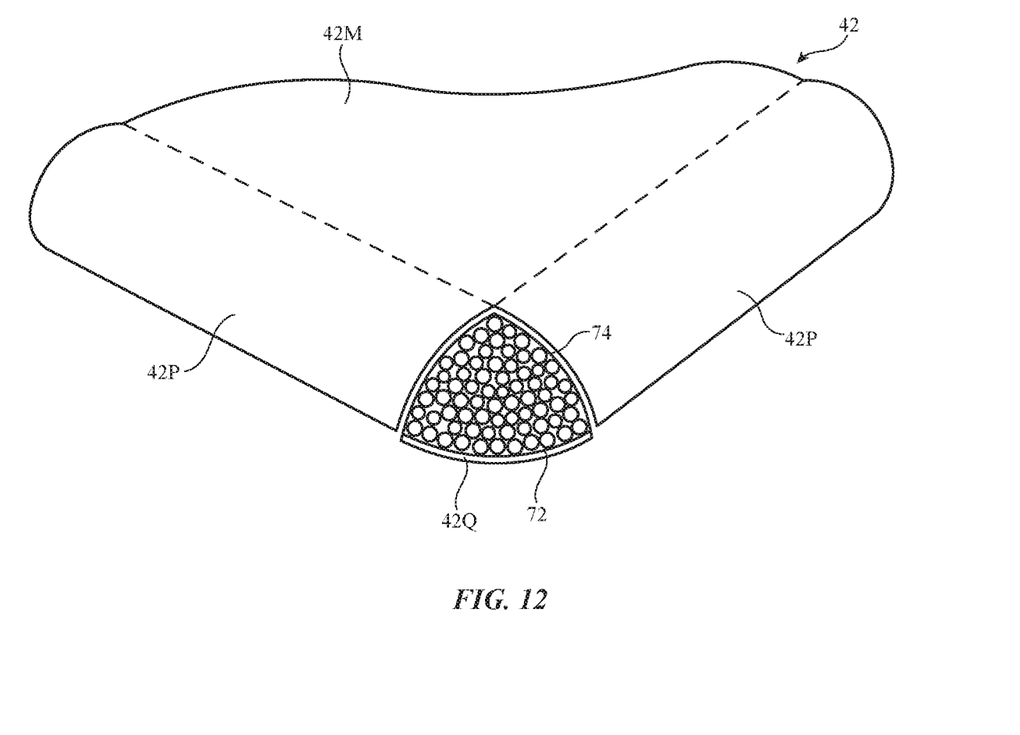
FIG. 12 is a perspective view of an illustrative corner portion of an electronic device with an image transport layer having a surface of compound curvature in accordance with an embodiment.

FIG. 12 shows how display layer 42 may have a planar central region 42M with a rectangular shape and elongated rectangular protrusions 42P (sometimes referred to as tabs) that extend along the peripheral edges of device 10. There may be, for example, four protrusions 42P each of which extends along a respective one of the four peripheral edges of device 10 (e.g., along left edge L, right edge R, upper edge T, and lower edge B). Device 10 may have curved sidewalls and some or all of protrusions 42P may be bent to exhibit a curved profile accordingly. Protrusions 42P may, for example, be bent to conform to the curved inner surface of display cover layer 40, as shown in FIG. 6. In the corner of device 10, a separate display layer 42Q may extend under image transport layer 74. Input surface 72 of image transport layer 74 may be planar and may receive an image from display layer 42Q. Layer 42Q may be an organic light-emitting diode display panel having a quarter-circle shape or other suitable shape, or may be other suitable light-emitting device (e.g., a pixel array that produces images, a light-emitting diode and diffuser that emits diffuse light, etc.). In device 10, display cover layer 40 may overlap display layer 42 shown in FIG. 6 (as an example). Display layer arrangements such as the arrangement of FIG. 12 may be used to produce images on front face FR, the sidewalls of device 10 (edges E), and/or rear face RR.

The foregoing is merely illustrative and various modifications can be made to the described embodiments. The foregoing embodiments may be implemented individually or in any combination.

What is claimed is:
1. An electronic device, comprising:
   first pixels that are configured to display a first image;
   second pixels that are configured to display a second image and that are separated by a gap from the first pixels;
   an image transport layer having a first input surface configured to receive the first image and a second input surface that is separated by the gap from the first input surface and that is configured to receive the second image, wherein the image transport layer has an output surface that includes a region with a curved profile and wherein the image transport layer is configured to display the first and second images as a merged unitary image; and
   a display cover layer that covers the output surface and that has four peripheral edges and four rounded corners.
2. The electronic device defined in claim 1 further comprising:
   communications circuitry configured to support wireless communications over a cellular telephone link, wherein the region of the output surface has compound curvature, wherein the first and second pixels are organic light-emitting diode pixels, wherein the display cover layer has an inner surface facing the output surface and an opposing outer surface, and wherein the display cover layer has sidewall portions with curved profiles.
3. The electronic device defined in claim 1 wherein the first pixels form a first organic light-emitting diode display panel, wherein the second pixels form a second organic light-emitting diode display panel, and wherein the first and second organic light-emitting diode display panels are separated by the gap.
4. The electronic device defined in claim 3 wherein the display cover layer has a portion with a curved surface profile.
5. The electronic device defined in claim 1 wherein the first pixels form a first portion of an organic light-emitting diode display panel and wherein the second pixels form a second portion of the organic light-emitting diode display panel.
6. The electronic device defined in claim 1 wherein the region with the curved profile is at one of the four rounded corners.
7. The electronic device defined in claim 1 wherein the first pixels form a planar display layer.
8. The electronic device defined in claim 7 wherein the first pixels and second pixels are formed on a common substrate.
9. The electronic device defined in claim 7 wherein the first pixels form a first display panel and wherein the second pixels form a second display panel that is separated from the first display panel by the gap.
10. The electronic device defined in claim 7 wherein the image transport layer comprises a coherent fiber bundle.
11. The electronic device defined in claim 7 wherein the image transport layer is formed from a layer of Anderson localization material configured to exhibit two-dimensional transverse Anderson localization of light from the first and second pixels.

12. An electronic device, comprising:
   a flexible display having a display surface that includes a region of pixels with a curved surface profile;
   an image transport layer that has an input surface adjacent to the display surface and that is configured to receive an image from the flexible display, wherein the image transport layer has a curved output surface configured to display the image, and wherein the curved output surface has compound curvature; and
   a display cover layer configured to overlap the curved output surface.

13. The electronic device defined in claim 12 wherein the display cover layer has regions with curved surface profiles and wherein the image transport layer comprises an image transport layer selected from the group consisting of: a coherent fiber bundle and a layer of Anderson localization material configured to exhibit two-dimensional transverse Anderson localization of light from the flexible display.

14. An electronic device, comprising:
   a first display having a rectangular central region and bent protrusions with curved surface profiles that run along respective edges of the rectangular central region, wherein the rectangular central region and bent protrusions are configured to display respective portions of a first image;
   a second display configured to produce a second image;
   an image transport layer having an input surface adjacent to the second display and an output surface configured to display the second image; and
   a display cover layer configured to overlap the first display.

15. The electronic device defined in claim 14 wherein the second display is planar and wherein the input surface is planar.

16. The electronic device defined in claim 15 wherein the output surface is curved and wherein a portion of the display cover layer covers the output surface.

17. The electronic device defined in claim 16 wherein the output surface has compound curvature and is located at a corner of the rectangular central region and wherein the image transport layer comprises a coherent fiber bundle.

18. The electronic device defined in claim 16 wherein the output surface has compound curvature and is located at a corner of the rectangular central region and wherein the image transport layer is formed from a layer of Anderson localization material configured to exhibit two-dimensional transverse Anderson localization of light from the second display.

* * * * *